United States Patent [19]

Bergeron et al.

[11] 4,229,753
[45] Oct. 21, 1980

[54] VOLTAGE COMPENSATION OF TEMPERATURE COEFFICIENT OF RESISTANCE IN AN INTEGRATED CIRCUIT RESISTOR

[75] Inventors: David L. Bergeron, Manassas; Geoffrey B. Stephens, Catlett, both of Va.

[73] Assignee: International Business Machines Corporation, Armonk, N.Y.

[21] Appl. No.: 825,759

[22] Filed: Aug. 18, 1977

[51] Int. Cl.² .................. H01L 23/56; H01L 29/66; H01L 27/02
[52] U.S. Cl. .................. 357/28; 357/51; 357/91; 338/7; 307/310
[58] Field of Search .............. 357/28, 29, 51, 23, 357/91; 307/310; 338/7

[56] References Cited

U.S. PATENT DOCUMENTS

| | | | |
|---|---|---|---|
| 3,017,520 | 1/1962 | Maupin | 357/28 |
| 3,936,789 | 2/1976 | Matzen et al. | 357/28 |
| 4,005,471 | 1/1977 | Magdo et al. | 357/91 |
| 4,044,371 | 8/1977 | Abdelrahman | 357/28 |
| 4,053,915 | 10/1977 | Cave | 357/23 |
| 4,126,496 | 11/1978 | Verderber | 357/28 |
| 4,132,998 | 1/1979 | Dingwall | 357/23 |

OTHER PUBLICATIONS

IBM Technical Disclosure Bulletin, vol. 16, No. 2, Jul. 1973, Temperature Detector for Integrated Circuit Chip, pp. 424-425.
IBM Technical Disclosure Bulletin, vol. 19, No. 5, Oct. 1976, Controlling the Temperature Coefficient of Resistance of Ion Implanted Resistors, pp. 1675-1676.

Primary Examiner—Andrew J. James
Attorney, Agent, or Firm—Maurice H. Klitzman

[57] ABSTRACT

A circuit technique is disclosed for compensating for changes in the resistance of an integrated circuit resistor in an epitaxial bed, which is exposed to temperature changes. The resistance of an integrated circuit resistor is a function of the temperature at which is operates. The invention is based on the recognition that the resistance of the resistor is also a function of the potential difference between the body of the resistor and the epitaxial bed itself. Temperature compensation is achieved by connecting a temperature sensing circuit to the epitaxial bed, which has a voltage output which varies inversely with respect to the temperature coefficient of resistance of the resistor. Thus, the net change in the resistance of the resistor as it undergoes a temperature change, approximates zero.

4 Claims, 4 Drawing Figures

VOLTAGE COMPENSATION OF TEMPERATURE COEFFICIENT OF RESISTANCE IN AN INTEGRATED CIRCUIT RESISTOR

FIELD OF THE INVENTION

The invention disclosed generally relates to semiconductor device circuits and more particularly relates to a temperature compensated integrated circuit.

BACKGROUND OF THE INVENTION

Resistors in the prior art have had the magnitudes of their resistance dependent upon their operating temperature, as characterized by their temperature coefficient of resistance, TCR. Many attempts have been made in the prior art to reduce the temperature coefficient of resistance.

Well known circuit techniques have been used in the prior art to compensate for changes in resistance due to temperature by placing a PN junction with an opposing temperature coefficient of impedance in series with the resistor.

These prior art attempts to solve the problem of resistance variation with temperature are limited in the range of resistance which can be compensated, in the non-linear characteristic of the series impedance, in the temperature range over which the TCR can be compensated and in the requirement for a compensation device for each resistor to be compensated.

Other examples of attempts to compensate for temperature change are covered in several patents. U.S. Pat. No. 3,683,306 to Bulthuis discloses the use of ion implantation to induce damage in the region within which the diffused resistor is formed so as to get a zero temperature coefficient of resistance.

U.S. Pat. No. 3,947,866 to Stellrecht discloses an ion implanted diffused resistor having a central portion which is deeper than a peripheral portion so that the central portion has a negative temperature coefficient of resistance and the peripheral portion has a positive temperature coefficient of resistance. The specification states that a net zero temperature coefficient of resistance can be obtained.

These prior arts attempt to solve the problem of a variation in magnitude of the resistance with operating temperature have raised still other problems such as increased processing complexity, limited range of resistivity, and limited temperature range over which the desired compensation takes place.

OBJECTS OF THE INVENTION

It is therefor an object of the invention to provide temperature compensation for a resistor in an improved manner.

It is a further object of the invention to provide temperature compensation for an ion implanted resistor in an improved manner.

It is another object of the invention to provide temperature compensation for a resistor without increasing processing complexity, without limiting the range of resistivity or unduly limiting the temperature range over which the compensation takes place.

SUMMARY OF THE INVENTION

These and other objects, features and advantages of the invention are accomplished by the integrated circuit device disclosed herein. A circuit technique is disclosed for compensating for changes in the resistance of a resistor in an epitaxial bed, which is exposed to temperature changes. The resistance of a resistor is a function of the temperature at which it operates. The invention is based on the recognition that the resistance of the resistor is also a function of the potential difference between the body of the resistor and the epitaxial bed itself. Temperature compensation is achieved by connecting a temperature sensing circuit to the epitaxial bed, which has a voltage output which varies inversely with respect to the temperature coefficient of resistance of the resistor. Thus, the net change in the resistance of the resistor as it undergoes a temperature change, approximates zero.

DESCRIPTION OF THE FIGURES

These and other objects, features and advantages of the invention will be more fully appreciated with reference to the accompanying figures.

DISCUSSION OF THE PREFERRED EMBODIMENT

A circuit technique is disclosed for compensating for changes in the resistance of an ion implanted or diffused resistor in an epitaxial bed, which is exposed to temperature changes. The resistance of an ion implanted or diffused resistor is a function of the temperature at which it operates. The invention is based on the recognition that the resistance of the ion implanted or diffused resistor is also a function of the potential difference between the most positive terminal of the resistor and the epitaxial bed itself. Temperature compensation is achieved by connecting a temperature sensing circuit to the epitaxial bed, which has a voltage output which varies inversely with respect to the temperature coefficient of resistance of the resistor. Thus, the net change in the resistance of the ion implanted or diffused resistor as it undergoes a temperature change, approximates zero.

DETAILED DESCRIPTION

Figure 1:
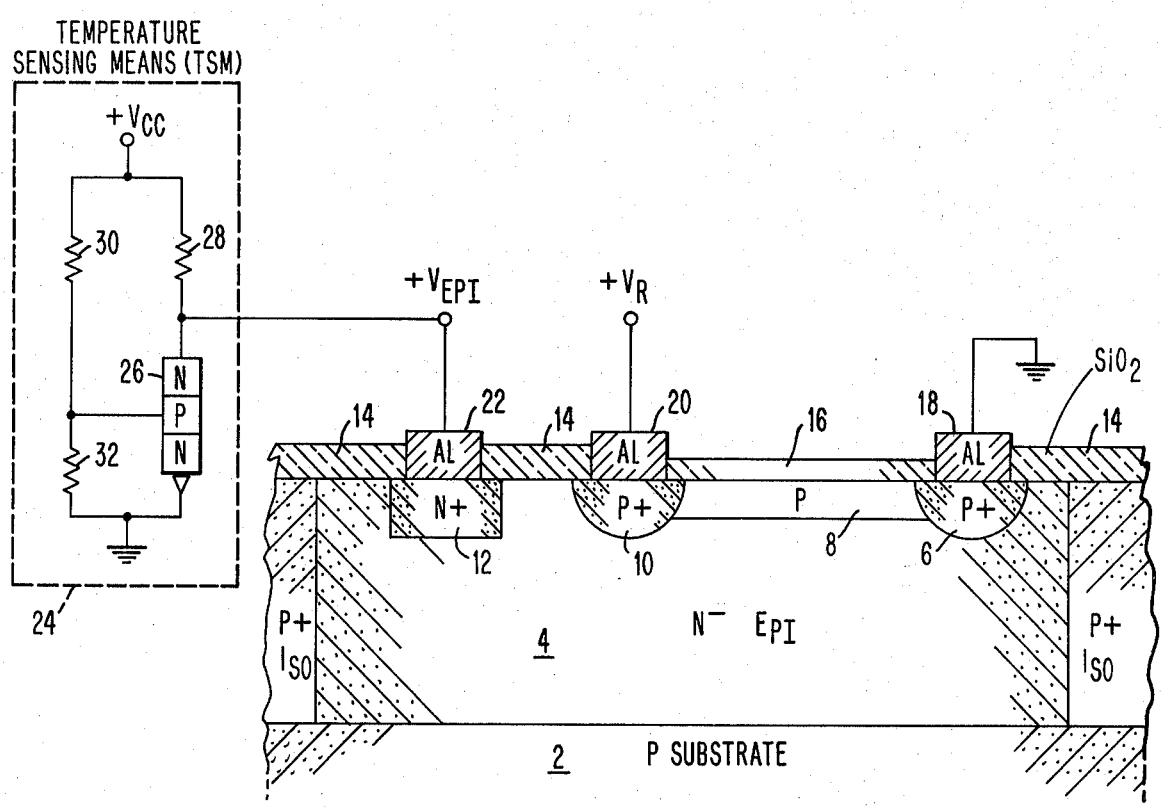
FIG. 1 shows a cross sectional view of an ion implanted resistor in its epitaxial bed and a schematic circuit diagram of the temperature compensation circuit.

Referring to FIG. 1, an epitaxial semiconductor layer 4 of N-type conductivity is shown deposited onto a substrate 2 of P-type conductivity material. P-type contact regions are shown at 6 and 10 with a P-type material resistor 8 therebetween in the epi. The resistor 8 is shown as ion implanted as the preferred embodiment for illustrative purposes, although the invention is applicable to any resistor where it is desired to compensate for changes in resistance due to changes in temperature. For example, the resistor can be diffused into the epi instead of ion implanting it.

The resistance of the ion implanted resistor 8 increases as its temperature increases. To compensate for this increase in resistance as the temperature increases, the voltage coefficient of resistance due to the potential difference between the epitaxial bed 4 and the resistor 8 must be caused to induce an equal and opposite change in resistance of the resistor 8. The PN junction surrounding the resistor 8 in the epitaxial bed 4 has a depletion layer which decreases in thickness as the potential difference between resistor 8 and epitaxial bed 4 decreases. Thus, as the temperature of the assembly increases, increasing the resistance of the resistor 8, the potential difference between the epitaxial bed 4 and the resistor 8 is caused to decrease in order for the depletion layer surrounding the resistor 8 to reduce encroachments into the cross-section of the resistor 8 to thereby effectively decrease its resistance. To do this, a circuit 24 is connected to the epitaxial bed 4 by means of the contact 12 and aluminum contact 22, which circuit decreases its output voltage $V_{epi}$ as the temperature of its environment increases. Likewise, contacts are provided at 18 and 20 as is well known in the art. Thus, by decreasing the potential $V_{epi}$ with respect to increases in temperature, the desired compensation of resistance for the resistor 8 is achieved.

The circuit 24 consists of a parallel pair of voltage dividers connected between $+V_{CC}$ and ground. In the first leg of the pair, the resistors 30 and 32 constitute one voltage divider with a tap therebetween connected to the base of the NPN transistor 26. The second leg of the pair of voltage dividers consists of the resistor 28 and NPN transistor 26 with their common node being the output node for the circuit generating the $V_{epi}$ voltage. The potential drop between $V_{CC}$ and the base of transistor 26 is maintained constant by means of the constant magnitude of $V_{CC}$ and the constant ratio of the resistances of resistors 30 and 32. Thus, the emitter-base voltage on the NPN transistor 26 is maintained constant. However, the PN junction formed at the emitter-base interface for the NPN transistor 26 changes its current carrying characteristics as the surrounding temperature changes.

As discussed above, the potential difference between the resistor 8 and the epitaxial bed 4 is decreased in order to provide a decrease in resistance due to the voltage coefficient of resistance imparted to the transistor. Since the resistor is biased positively, and the epitaxial bed biased positively with respect to the resistor, a negative-going change in voltage must be imposed on the epitaxial bed in order to decrease the resistance of the resistor 8 ($V_{epi} > V_R$ in FIG. 1). To provide a negative-going change, the circuit 24 is made to generate a negative-going change in the $V_{epi}$ as the temperature increases. This is achieved by the transistor 26 conducting current more readily as the temperature increases, thereby causing a greater current to flow through the series connected resistor 28, causing a greater IR drop across it, thus reducing the potential at its output node so that $V_{epi}$ is decreased as the temperature increases. By selecting the appropriate relative magnitudes of the resistors 28, 30 and 32, a magnitude of change in $V_{epi}$ is achieved which generates a corresponding decrease in the resistance of the resistor 8 due to the voltage coefficient of resistance, which exactly counteracts the increase in the resistance of the resistor 8 due to its increase in temperature.

By maintaining a constant base emitter potential across the resistor 32 and increasing the transconductance of the transistor 26 as its temperature increases, a greater amount of current can be conducted through the series connected resistor 28, thereby reducing the magnitude of $V_{epi}$ at its output node, as is desired.

Figure 2:
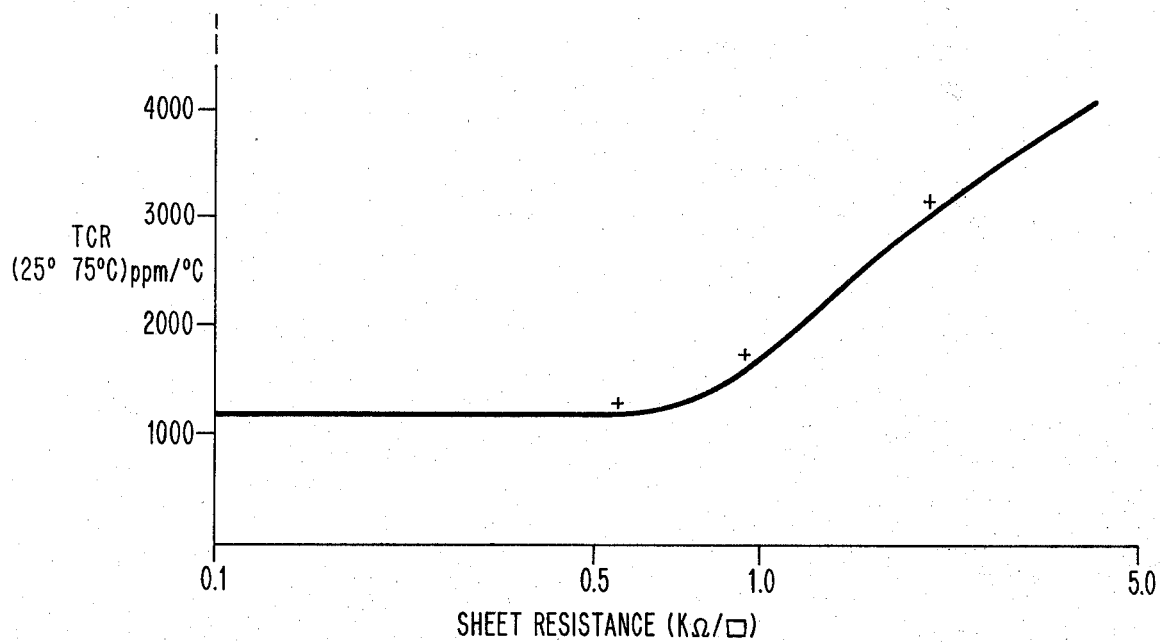
FIG. 2 is a graph of TCR versus sheet resistance for ion implanted resistors.

Now referring to FIG. 2, a graph of temperature coefficient of resistance (TCR) versus sheet resistance is shown for ion implanted resistors for a particular set of process conditions over a range of ion implant doses to give sheet resistances from 100 ohm per square to 5000 ohms per square. The TCR is seen to range from approximately 1100 parts per million per degree centigrade (ppm/°C.) to over 4000 ppm/°C. for this range of sheet resistance. Other curves with higher or lower TCR can be achieved by changing process conditions, particularly implant energy, oxide thickness, background (epitaxy) concentration and implant anneal time and temperature.

It can be seen, for example, from FIG. 2 that a resistor with a sheet resistance of 5000 ohms per square will have a TCR of approximately 4000 ppm/°C. Thus, a resistor whose resistance is 10,000 ohms at 25° C. will have a resistance of $10,000 + 10,000 \times 4,000 \times 10^{-6}$ (75-25) or 12,000 ohms at 75° C.

Figure 3:
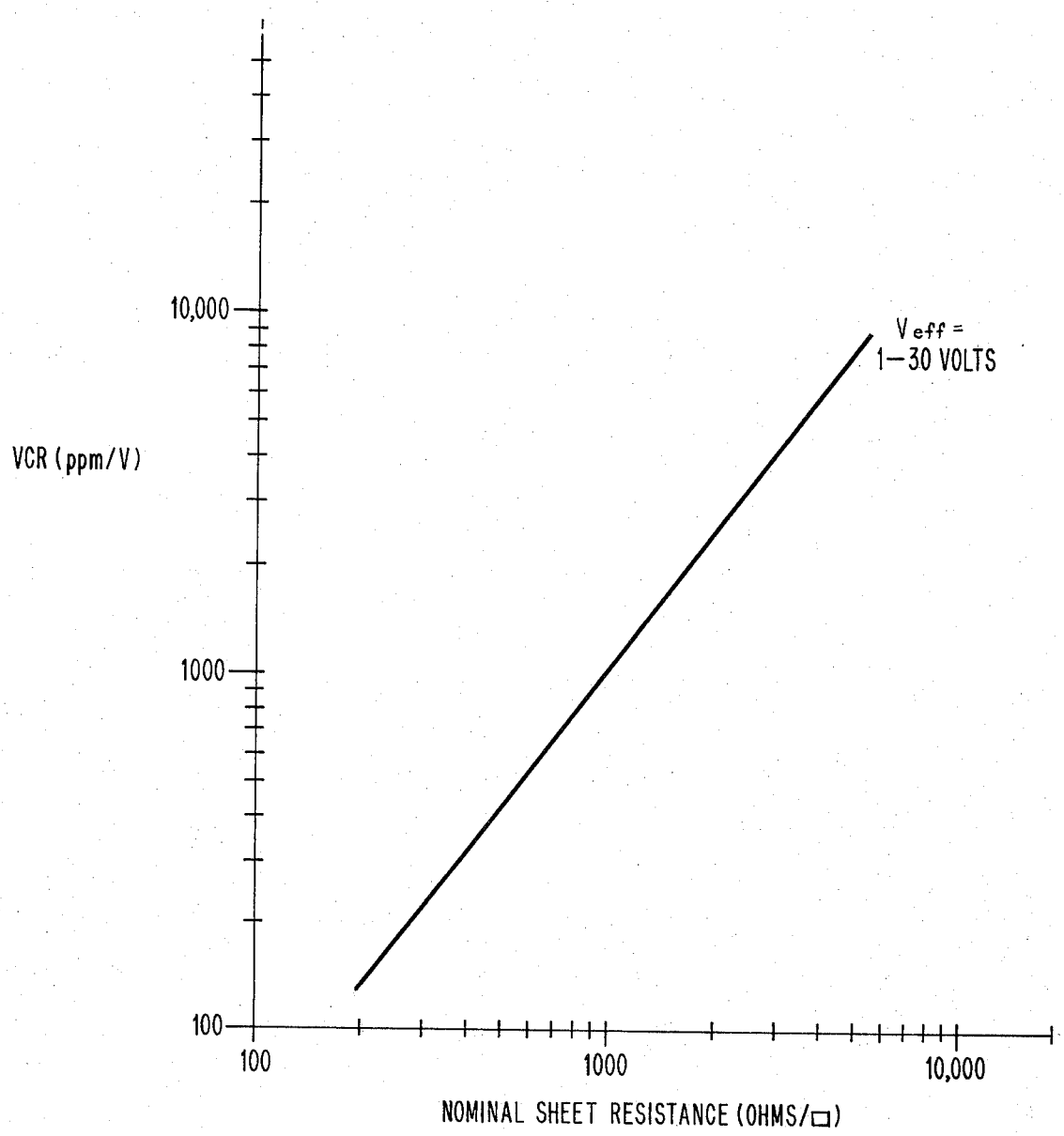
FIG. 3 is a graph of the voltage coefficient of resistance (VCR) versus sheet resistance for the same set of process conditions and implant dose range as in FIG. 2.

FIG. 3 shows a graph of the voltage coefficient of resistance (VCR) verses sheet resistance for the same set of process conditions and implant dosage range as in FIG. 2. The change in resistance with voltage is due to the depletion of carriers along the PN junction formed between the resistor region and the oppositely doped epitaxy background region. The width of the region which is depleted of carriers is a function of the doping concentration on both sides of the junction as well as the potential difference (electric field) across the junction.

The potential (bias) across the PN junction is a function of both the potential applied to the epitaxial bed relative to the positive end of the resistor and the potential applied across the ends of the resistor. The total effect of these two potentials can be expressed as a combined effective voltage ($V_{eff}$) which can be expressed algebraically by:

$$V_{eff} = V_{epi} - (+V_R) + (V_R/2)$$

or as the average potential difference across the resistor-epitaxy junction.

From the relations shown in FIGS. 2 and 3 it is seen that an increase in resistance due to increasing temperature can be offset by a decrease in the effective voltage applied across the PN junction.

For example, a 5000 ohm per square resistor at 25° C. having a TCR of 4,000 ppm/°C. and VCR of 10,000 ppm/V will have a nearly constant value from 25° C. to 75° C. if the epitaxial bias relative to the positive end of the resistor is adjusted from 30 volts at 25° C. to 10 volts at 75° C. The adjustment of the epitaxy bias is provided by the circuit of FIG. 1 where the temperature sensing circuit is placed in close proximity to the resistor that is being compensated such that the temperature of the resistor is the same or nearly the same as the temperature of the sensing circuit.

Examples of other possible implementations include the use of a P diffusion within an N epi bed and the epi bed is used to form a resistor whose change with temperature is compensated by changes in the depletion region formed by the reverse biased P region.

Another example consists of forming a resistor using a P diffusion in an N epi layer such as would be used to form a transistor base region which is overlapped by a shallower N+ diffusion such as that used to form a transistor emitter region to form what is commonly called a pinch resistor. Compensation of the change with temperature of the P resistor is achieved by varying the reverse bias on the N+ and epi regions with respect to the P resistor region.

Figure 4:
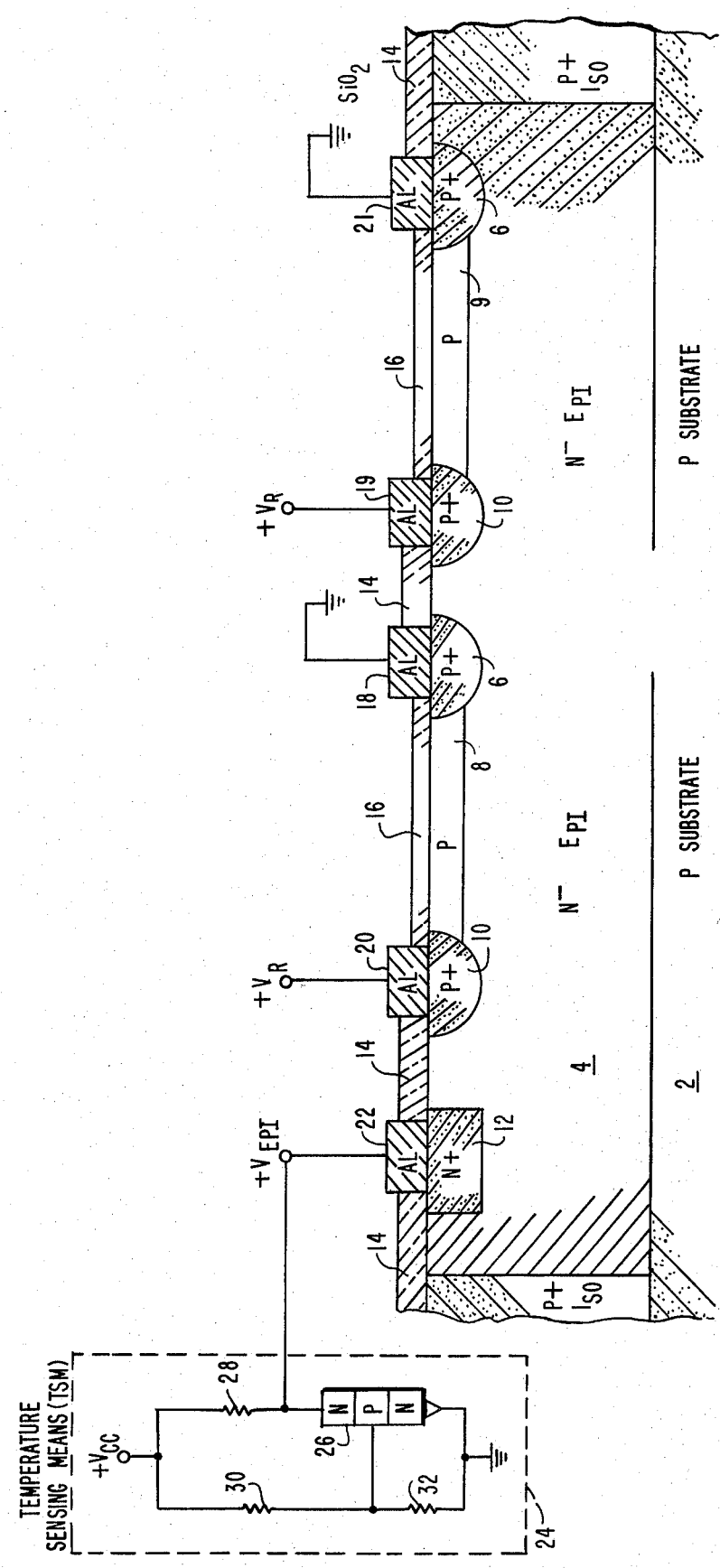
FIG. 4 shows a cross-sectional view of a plurality of resistors in an epitaxial region.

Further, the preferred embodiment can be extended in FIG. 4 to compensate a multiplicity of resistors 8 and 9 in a common epi bed using just one temperature sensing circuit with additional contacts 19 and 21 being provided.

While the invention has been particularly shown and described with reference to the preferred embodiment thereof, it will be understood by those skilled in the art that the foregoing and other changes in form and details may be made therein without departing from the spirit and scope of the invention.

We claim:

1. A temperature compensated integrated circuit semiconductor resistor, comprising:
    a first resistor region of a second conductivity type formed in an epitaxial semiconductor layer of a first conductivity type, having electrical contacts on opposing ends, one of said contacts being connected to a reference potential;
    said resistor having a positive voltage coefficient of resistance and a predetermined temperature coefficient;
    temperature sensing means formed in proximity to said resistor on said integrated circuit, having a voltage output terminal connected to said epitaxial layer and a second terminal connected to said reference potential;
    said temperature sensing means having, on said voltage output terminal, a voltage output characteristic with respect to temperature which varies inversely with respect to the temperature coefficient of resistance of said resistor;
    variations in the resistance of the resistor due to temperature changes being compensated for by corresponding changes in the voltage of the epitaxial layer induced by said temperature sensing means.

2. A temperature compensated integrated circuit semiconductor resistor, comprising:
    an epitaxial semiconductor layer of a first conductivity type having a resistor of a second conductivity type disposed therein;
    temperature sensing means having a voltage output terminal connected to said epitaxial layer;
    said temperature sensing means having a voltage output characteristic with respect to temperature which varies inversely with respect to the temperature coefficient of resistance of said resistor;
    variations in the resistance of the resistor due to temperature changes being compensated for by corresponding changes in voltage of the epitaxial layer induced by said temperature sensing means.

3. The combination of claim 2 wherein the temperature sensing means includes a transistor circuit adjacent said resistor.

4. A plurality of temperature compensated integrated circuit semiconductor resistors, comprising:
    a plurality of resistor regions of a second conductivity type formed in an epitaxial semiconductor layer of a first conductivity type, each having electrical contacts on opposing ends, one of said contacts being connected to a reference potential;
    said resistors having a positive voltage coefficient of resistance and a predetermined temperature coefficient;
    temperature sensing means formed in proximity to said resistors on said integrated circuit, having a voltage output terminal connected to said epitaxial layer and a second terminal connected to said reference potential;
    said temperature sensing means having, on said voltage output terminal, a voltage output characteristic with respect to temperature which varies inversely with respect to the temperature coefficient of resistance of said resistors;
    variations in the resistance of the resistors due to temperature changes being compensated for by corresponding changes in the voltage of the epitaxial layer induced by said temperature sensing means.

* * * * *